United States Patent
Davis et al.

[19]

[11] Patent Number: 5,977,834

[45] Date of Patent: Nov. 2, 1999

[54] PREAMPLIFIER SYSTEM

[75] Inventors: Carlton D. Davis, Baltimore; Jack J. Hawkins, Ellicott City, both of Md.

[73] Assignee: CBS Corporation, Pittsburgh, Pa.

[21] Appl. No.: 09/054,384

[22] Filed: Apr. 3, 1998

[51] Int. Cl.$^6$ ........................................................ H03F 3/04
[52] U.S. Cl. ............................................ 330/302; 330/310
[58] Field of Search ..................................... 330/302, 310, 330/311, 134, 284

[56] References Cited

U.S. PATENT DOCUMENTS

| | | | |
|---|---|---|---|
| 4,075,576 | 2/1978 | Eden | 330/277 |
| 4,268,797 | 5/1981 | Buck et al. | 330/277 |
| 4,591,802 | 5/1986 | Asazawa | 330/277 |
| 5,010,588 | 4/1991 | Gimlett | 455/619 |
| 5,532,650 | 7/1996 | Igarashi | 330/300 |
| 5,812,221 | 9/1998 | Davis et al. | 348/723 |

*Primary Examiner*—Benny Lee
*Assistant Examiner*—Henry Choe
*Attorney, Agent, or Firm*—Robert P. Lenart; Eckert Seamans Cherin & Mellott, LLC

[57] ABSTRACT

A preamplifier system (10) is provided which amplifies and conditions an input electromagnetic signal for insertion into a high power amplifier. The preamplifier system (10) includes a plurality of cascaded amplifying stages (100a–100d) for incrementally amplifying the input electromagnetic signal, as well as bias control circuitry coupled to the amplifying stages (100a–100d) to electrically bias at least one of those stages into a Class A operational mode and an adjustable phase shift unit (300) coupled to at least one of the amplifying stages (100a–100d) for reversibly shifting the phase of the input electromagnetic signal in accordance with the given high power amplifier's configuration. Each amplifying stage (100a–100d) includes at least one transistor assembly device (110a–110d) having integrally formed therein a plurality of silicon carbide cells coupled one to the other. The amplifying stages (100a–100d) collectively operate in stable, substantially linear manner to effect a predetermined level of gain in high power applications.

23 Claims, 6 Drawing Sheets

PREAMPLIFIER SYSTEM

BACKGROUND OF THE INVENTION

1. Field of the Invention

The subject preamplifier system is generally directed to a system for amplifying and conditioning an input electromagnetic signal for insertion into a high power amplifier. More specifically, the subject preamplifier system is directed to a system employing multi-cell silicon carbide transistor assembly devices to preamplify an RF signal with a relatively high gain while substantially preserving operational linearity.

Factors such as high power density—that is, the ability to yield high power levels for a given device size and weight—along with factors such as the degree of voltage and temperature tolerance are quite critical in many electrical applications, particularly in high power applications. The capacity to tolerate higher operating voltages, for instance, enables an active electrical device to operate with lower currents, hence with greater efficiency. Similarly, the capacity to tolerate higher operational temperatures generally enables an active electrical device to yield greater power while diminishing the likelihood of irreparable damage to the device when subjected to a given set of operating conditions. Indeed, temperature tolerance is not only a significant limiting factor to the safe operating point of a given electrical device, it is a significant limiting factor to the space density with which a plurality of such devices may be physically disposed within a space allocated therefor without necessitating overly elaborate cooling measures.

Another factor of considerable concern in many applications is the system's operational frequency bandwidth. Currently, in RF broadcast applications such as transmission within the UHF TV frequency range, known systems invariably offer operational bandwidths not substantially wider than one transmission channel, which is approximately 6 MHz wide. A broadcast system typically employs a plurality of transmitter modules; hence, each module must then be individually tuned for the particular transmit channel to be utilized. The need for such tedious tuning would be obviated were there available for use system modules offering operational frequency bandwidths wide enough to encompass a plurality of transmission channels without significant compromise of their operation in other respects. Any tuning of the system modules beyond the course pre-tuning performed during their manufacture would be unnecessary so long as system modules pre-tuned to a bandwidth encompassing the desired transmission channel are employed.

Another parameter of notable concern in RF broadcast applications is the linearity with which at least certain portions of the given system operate. It is highly desirable in such systems as a preamplifier system that the response characteristic of the amplification section therein remain stable for the full range of possible input signals. It is further desirable that this linearity of operation be preserved while maintaining optimal levels of power density and bandwidth.

2. Prior Art

Preamplifier systems employing cascaded amplifying stages are known in the art. Silicon carbide transistor devices are also known in the art. The best prior art known to Applicants includes U.S. Pat. Nos. 4,631,492; 4,670,789; 4,710,815; 4,800,426; 5,134,485; 5,686,737; 5,270,554; and, 5,726,605. The systems known in the prior art, however, do not include a preamplifier system which yields the combined degree of power density, voltage and temperature tolerance, wide bandwidth, and operational linearity yielded by the subject preamplifier system.

Silicon-based active electrical devices which are prevalent in the art do not offer the power density and voltage/temperature tolerance offered by silicon carbide transistor devices. Consequently, silicon carbide transistor devices have been utilized in the art in numerous applications requiring high peak power, pulsed operation of the active device. Such devices were, therefore, invariably operated in either Class B or Class C operational modes. There is no system heretofore known incorporating silicon carbide transistor devices wherein substantially linear operation thereof is realized, much less a system wherein such linear operation accompanied by an operational frequency bandwidth great enough to encompass a plurality of 6 MHz-video transmission channels is realized.

SUMMARY OF THE INVENTION

It is a primary object of the present invention to provide a power amplifier system wherein high power amplification is effected while substantial linearity of operation is maintained.

This and other objects of the present invention are attained in the subject preamplifier system for amplifying and conditioning an input electromagnetic signal for insertion into a high power amplifier. The subject preamplifier system generally comprises a plurality of cascaded amplifying stages for incrementally amplifying the input electromagnetic signal; bias control circuitry coupled to the amplifying stages for electrically biasing each amplifying stage; and, an adjustable phase shift unit coupled to at least one of the amplifying stages for shifting the phase of the input electromagnetic signal based on a predetermined reference signal. Each of the cascaded amplifying stages includes at least one transistor assembly device defined by a plurality of integrally formed silicon carbide transistor cells coupled one to the other. The transistor assembly device of at least one amplifying stage has integrated therein a greater number of silicon carbide transistor cells than the transistor assembly device of at least one other amplifying stage within the preamplifier system. The bias control circuitry respectively biases each amplifying stage to operate in one of a plurality of predetermined operational modes which include a Class A mode and a Class AB mode. The bias control circuitry maintains at least one of the amplifying stages in a Class A operational mode.

DETAILED DESCRIPTION OF THE PREFERRED EMBODIMENTS

Figure 1:
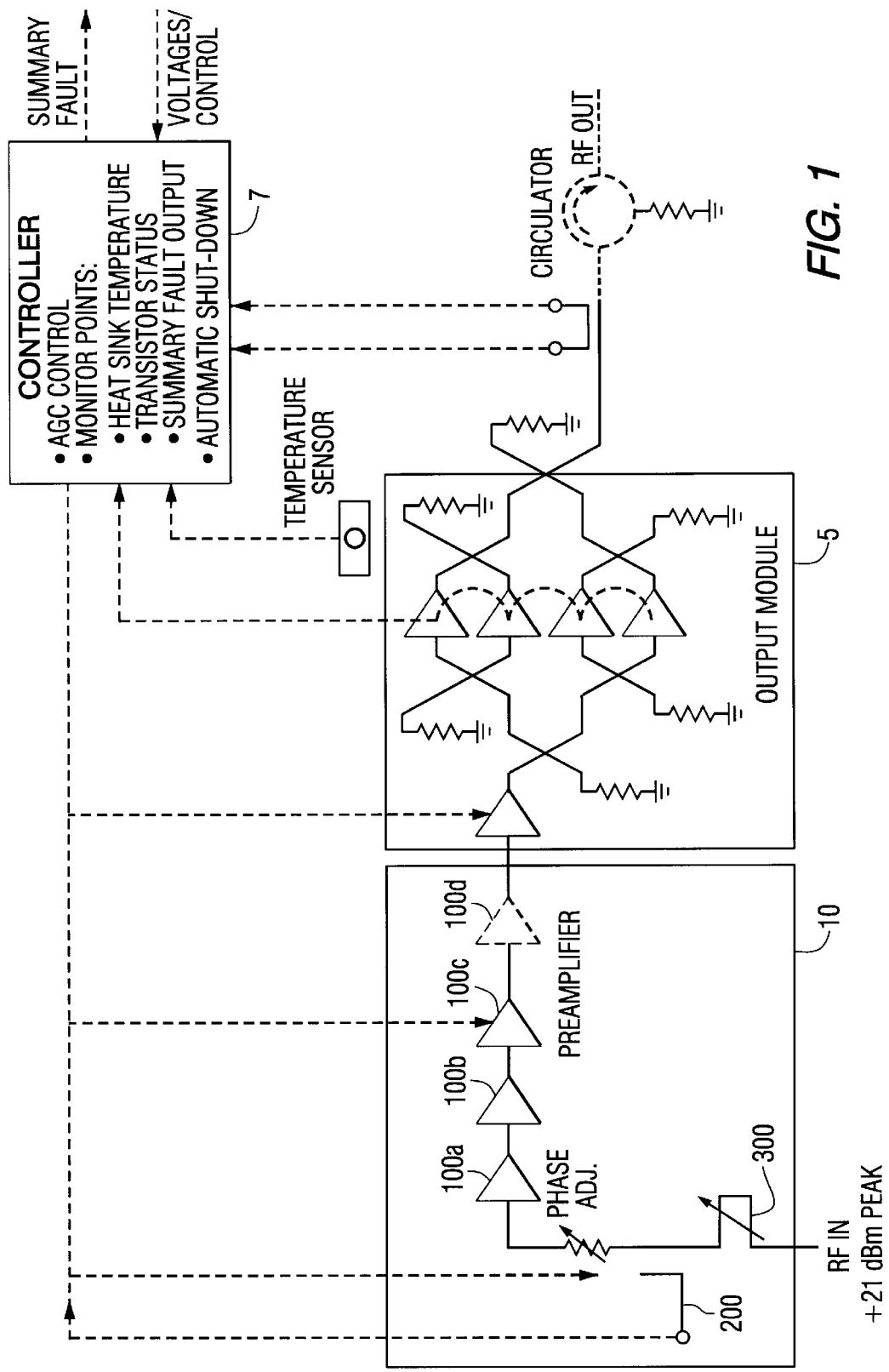
FIG. 1 is a schematic diagram illustrating a preferred embodiment of the present invention incorporated in an exemplary application.

Turning to FIG. 1, there is shown an illustrative schematic diagram of the subject preamplifier system 10 shown in an exemplary application driving a high power amplifier 5 and monitored and controlled by a control system 7. Preamplifier system 10 generally comprises an amplification section containing a plurality of cascaded amplifying stages 100a–100d and having a manually adjustable phase shifter 300 coupled at its input through a variable attenuator 200. Though not shown in FIG. 1, preamplifier system 10 preferably also includes, disposed between phase shifter 300 and variable attenuator 200, a coupler—preferably, though not necessarily a 3 dB splitter—which diverts approximately half the energy in the input RF signal passing from phase adjuster 300 to an input power detector unit (also not shown).

The input power detector unit samples and rectifies that portion of the input RF signal diverted thereto by the 3 dB splitter and makes the resulting signal available to control system 7 which, responsive to a comparison of that signal with a similarly detected signal indicative of the RF power at the output of high power amplifier 5, applies the necessary signal to variable attenuator 200 to effect the appropriate input RF signal attenuation. Automatic gain control is thereby realized so as to maintain the gain yielded by preamplifier system 10 and high power amplifier 5 within a desired range.

In a typical application of the present invention, a plurality of preamplifier systems 10 are respectively coupled to a plurality of both high power amplifier systems 5 and control systems 7 corresponding thereto to form a plurality of high power amplification modules. It is thus important for proper operation of the resulting amplifier modules that the insertion phases of the input RF signals at such amplification modules be substantially aligned. A predetermined reference signal is, therefore, established, preferably by a designated reference power amplifier; and, the insertion phases are adjusted as necessary with respect to that reference signal. Accordingly, a manually adjustable phase shifter 300 of a suitable type known in the art is included in each preamplifier system 10 in order that such phase alignment may be effected during system set-up and initiation.

It is not essential to the present invention that phase shifter 300 be of a manually adjustable type, nor that phase shifter 300 be located at any particular position relative to the other components of preamplifier system 10. An automatically adjusted phase shifter may be employed; however, the typical absence in most of the conceivable applications of significant drift in insertion phase weighs heavily against incorporating such automatic adjustment means and its attendant costs in circuit complexity and expense. Moreover, as it is intended for control over signal insertion phase into high power amplifier 5, phase shifter 300 may be disposed at other points relative to amplifying stages 100a–100d within preamplifier system 10, so long as appropriate compensatory measures are taken to prevent disruption of other functions (such as the signal power comparisons necessary for automatic gain control).

Variable attenuator 200 is preferably a voltage controlled attenuator device of a suitable type known in the art. In the application shown, it is controlled by control system 7, responsive to the automatic gain control processing which occurs therein, to apply the degree of attenuation necessary to realize the required adjustment in gain.

The amplification section coupled to variable attenuator 200 is formed by a plurality of cascaded amplifying stages 100a–100d, each of which includes at least one silicon carbide transistor assembly provided with a bias control circuit. While four cascaded amplifying stages 100a–100d are included in the embodiment of preamplifier 10 shown, the present invention is not limited to the use of four such stages. For instance more stages may be employed where greater overall gain were desired. It is only important in this regard that the stages utilized and the biasing circuits therefor be configured such that the combined degree of amplification and linearity attained by the resulting amplification section be sufficient to support the intended application.

In most cases, though, the user endeavors to realize maximum power amplification while maintaining substantial linearity of operation. To those often competing ends, amplifying stages 100a–100d each employ, in accordance with the present invention, at least one transistor assembly defined by a plurality of commonly integrated silicon carbide transistor cells, along with bias control circuitry through which the given transistor assembly is selectively biased to a predetermined mode of operation. The transistor assembly employed is preferably of an integrated structure type known in the art wherein a plurality of silicon carbide static induction transistor cells are arranged and coupled together in parallel. The aggregation of cells, together with their material properties, contribute to a degree of voltage and temperature tolerance and level of power density significantly greater than could be realized with comparable silicon devices.

For the embodiment and its exemplary application shown, it was determined that an optimal combination of linearity and efficient power amplification would be realized by use of four amplifying stages 100a–100d, wherein the first cascaded pair 100a, 100b are biased by their respective biasing control circuitry to operate in a Class A operational mode and the second cascaded pair 100c, 100d are biased by their bias control circuitry to operate in a Class AB operational mode. Operating in Class A mode, the first pair of amplifying stages 100a, 100b operate at lower power levels than the second pair of amplifying stages 100c, 100d, but with a high degree of linearity. The drain currents through the transistor assemblies of those amplifying stages 100a, 100b essentially remain constant through each period of operation. Operating in Class AB mode, the second pair of amplifying stages 100c, 100d operate with higher power levels than do the first pair, but the drain currents through their respective transistor assemblies tend to vary with the signal power levels applied thereto.

In the embodiment shown, the size of the transistor assemblies selected for amplifying stages 100a–100d were varied in view of the intended application and the operational tolerances permitted thereby. The Class A amplifying stages 100a, 100b each employ a 6-cell silicon carbide transistor assembly, whereas the Class AB amplifying stages 100c, 100d each employ a 12-cell silicon carbide transistor assembly. Other transistor assemblies having differing numbers of transistor cells may be employed in place of those shown, if the intended application's requirements so permit. Silicon carbide transistor assemblies having as many as 84 transistor cells, for instance, are readily realizable in the art, as are transistor assemblies containing 36, 24, 14, or other numbers of transistor cells. All other factors being equal, a greater number of cells translates into a greater maximum output power level; however, factors such as operational efficiency must be considered in selecting a particular silicon carbide transistor assembly configuration for a given application.

Figure 2:
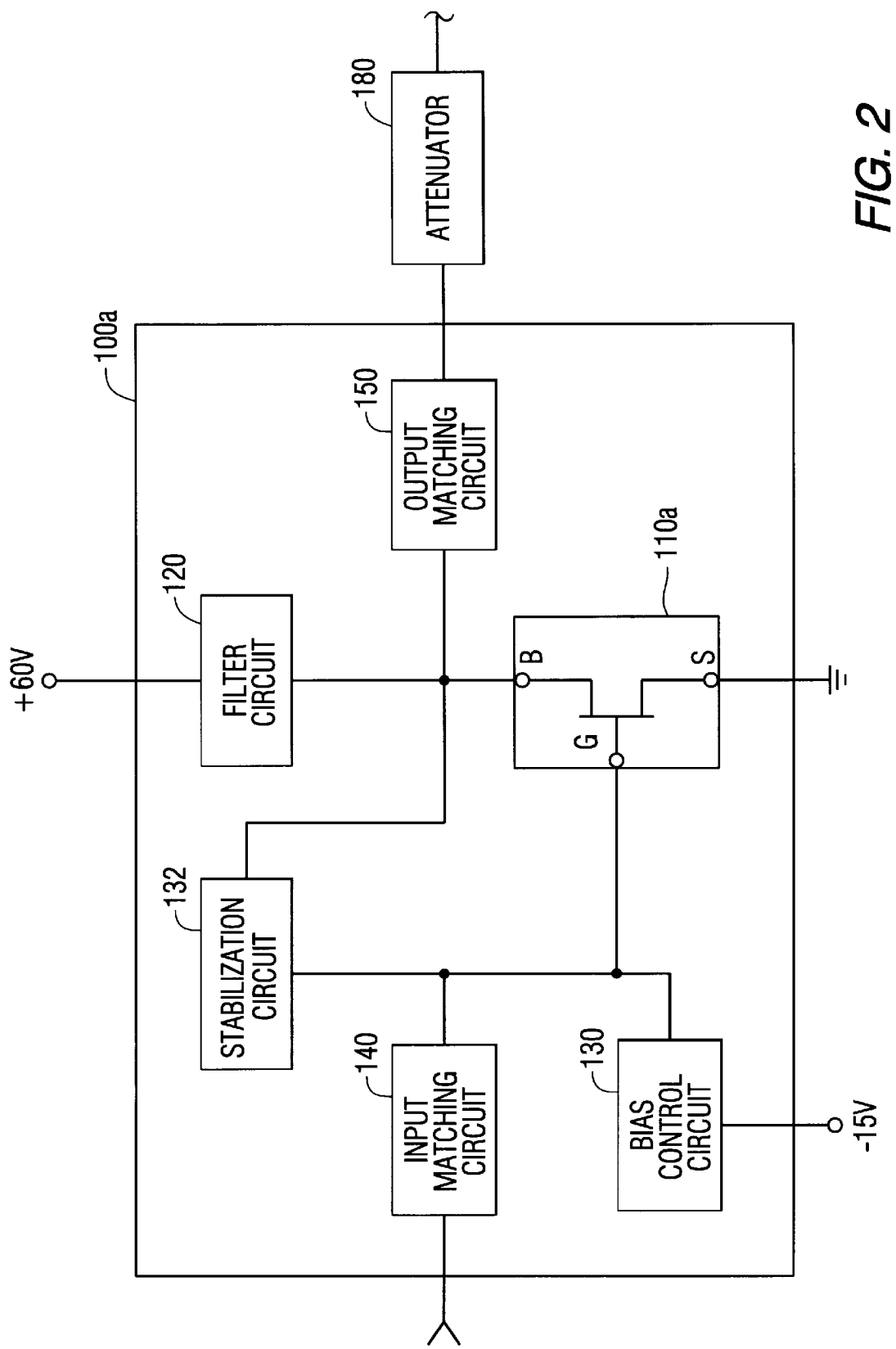
FIG. 2 is a schematic block diagram illustrating an exemplary portion of a preferred embodiment of the present invention.

Turning now to FIG. 2, there is shown an exemplary schematic block diagram of one portion of the embodiment of preamplifier system 10 shown in FIG. 1. Generally, with the drains of the transistor cells in each of the amplifying stage transistor assemblies 110a–110d biased using a +60 V supply voltage and the gates thereof biased using a −15 V source, preamplifier system 10 yields approximately +36 dB of gain and generates, in substantially linear manner, an average output power of approximately 6 W.

Referring in more detail to FIG. 2, only the first amplifying stage 100a, along with its accompanying coupling attenuator 180, is shown, as subsequent stages 100b–100d are substantially identical to the first stage 10a, at least at the illustrated level of functional detail. Coupling attenuator 180 is a fixed attenuator that is preferably, though not necessarily, coupled between adjacent pairs of amplifying stages 100a–100d to optimize stage-to-stage isolation. As such, coupling attenuator 180 is preferably coupled to only the outputs of amplifying stages other than the final amplifying stage 100d.

It is to be understood that each of the functional units shown within amplifying stage 100a is also included, interconnected with the other units in the manner shown in each of the other amplifying stages 100b–100d. The index numbers of those units, except that of transistor assembly 110a, for brevity, do not include the amplifying stage-identifying letter designation "a."

As shown, exemplary amplifying stage 100a includes a filter circuit 120 which couples the drain terminal D of transistor assembly 110a to a +60 V DC supply voltage. Filter circuit 120 serves essentially to filter out any rippling noise and any AC signal component that might otherwise contaminate the supply signal applied at the drain terminal D of transistor assembly 110a. Filter circuit 120 also includes, preferably, a fuse device of a suitable type known in the art to protect external power supplies and circuitry from excessive current levels.

Coupled to the gate terminal G of transistor assembly 110a is a bias control circuit 130 formed by a plurality of components, one of which is preferably a circuit component having variable resistance. This variable resistance enables a user to vary the voltage of the signal derived from a −15 V DC power supply that is actually applied to the gate terminal G of transistor assembly 110a. It is preferably by this adjustment that transistor assembly 110a is biased to either of the Class A or Class AB modes of operation.

Bias control circuit 130 includes one or more filtering elements to filter out any rippling noise and AC signal components. Bias control circuit 130 also includes a stabilization circuit 132 shown separately designated in FIG. 2. Stabilization circuit 132 is preferably realized as a feedback circuit coupled between the drain terminal D and the gate terminal G of transistor assembly 110a. The feedback circuit, shown in greater detail in FIG. 3a and FIG. 3b, preferably contains passive resistance, capacitance, and inductance components which together serve to stabilize—that is, abate oscillations in—the operation of transistor assembly 110a. If stabilization circuit 132 were not employed, sufficiently stable operation yielding a substantially flat gain characteristic would not result, at least without significant compromise of bandwidth and gain.

Amplifying stage 100a also includes an input impedance matching circuit 140 coupled to the gate terminal G of transistor 110a and an output impedance matching circuit 150 coupled to the drain terminal D of transistor assembly 110a. In addition to respectively establishing the input and output impedances necessary for appropriate coupling to devices external to the given amplifying stage, matching circuits 140, 150 serve to flatten the gain characteristic of the amplifying stage across the operational frequency band thereof. Matching circuits 140, 150 serve also to broaden the operational bandwidth of the given amplifying stage 100a to encompass a plurality of the approximately 6 MHz-wide transmit channels in UHF TV band broadcast applications. In accordance with the present invention, operational bandwidths greater than 24 MHz, or more than 4 transmit channels wide, are typically realized, far exceeding the heretofore practicable limit in the art—for high power applications—of bandwidths not much greater than the 6 MHz width of a UHF transmit channel.

Figure 3A:
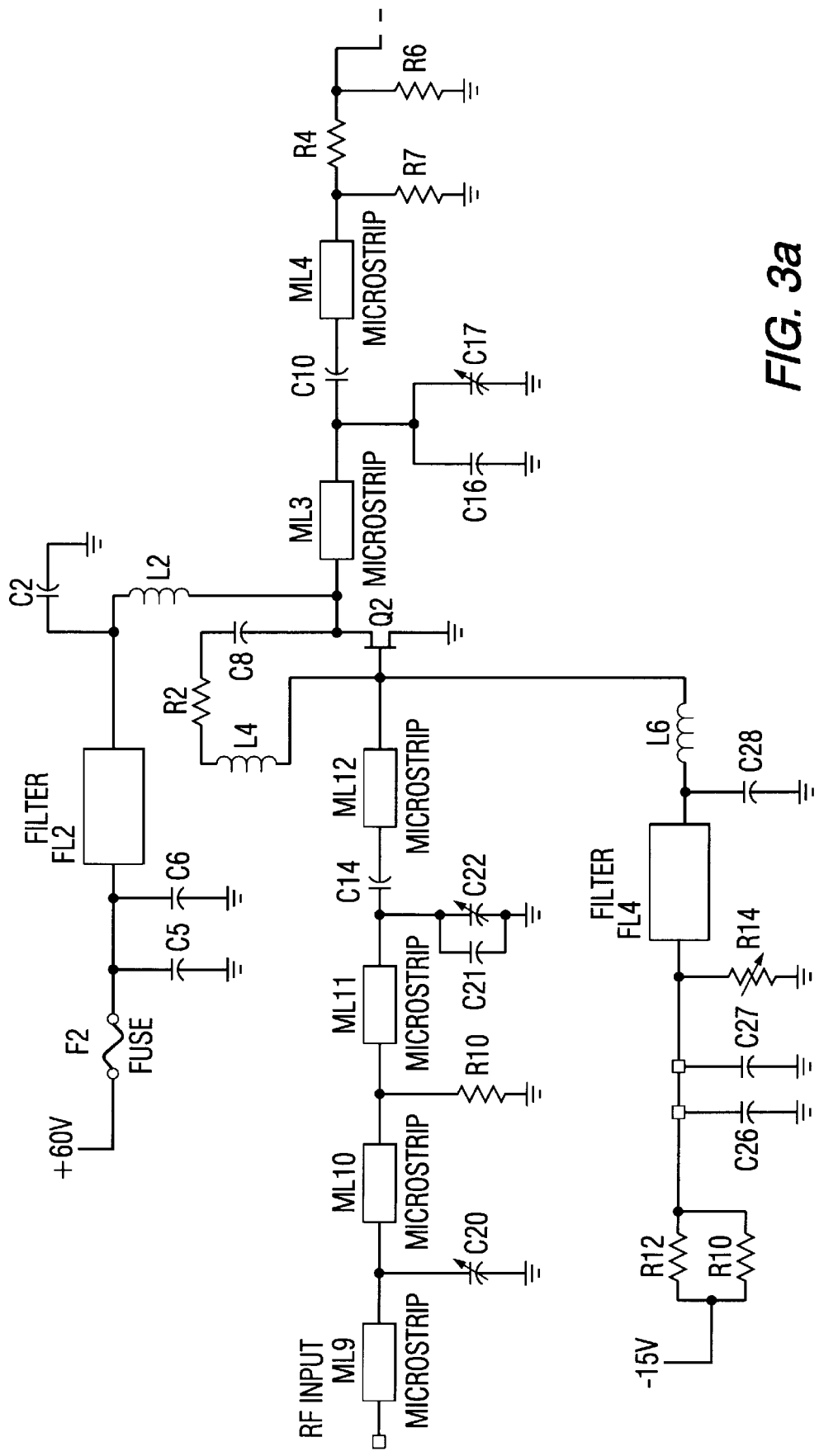
FIG. 3a is the first half of a circuit schematic diagram of an amplification section in a preferred embodiment of the present invention; and, FIG. 3b is the second half of a circuit schematic diagram of an amplification section in a preferred embodiment of the present invention.
Figure 3A:
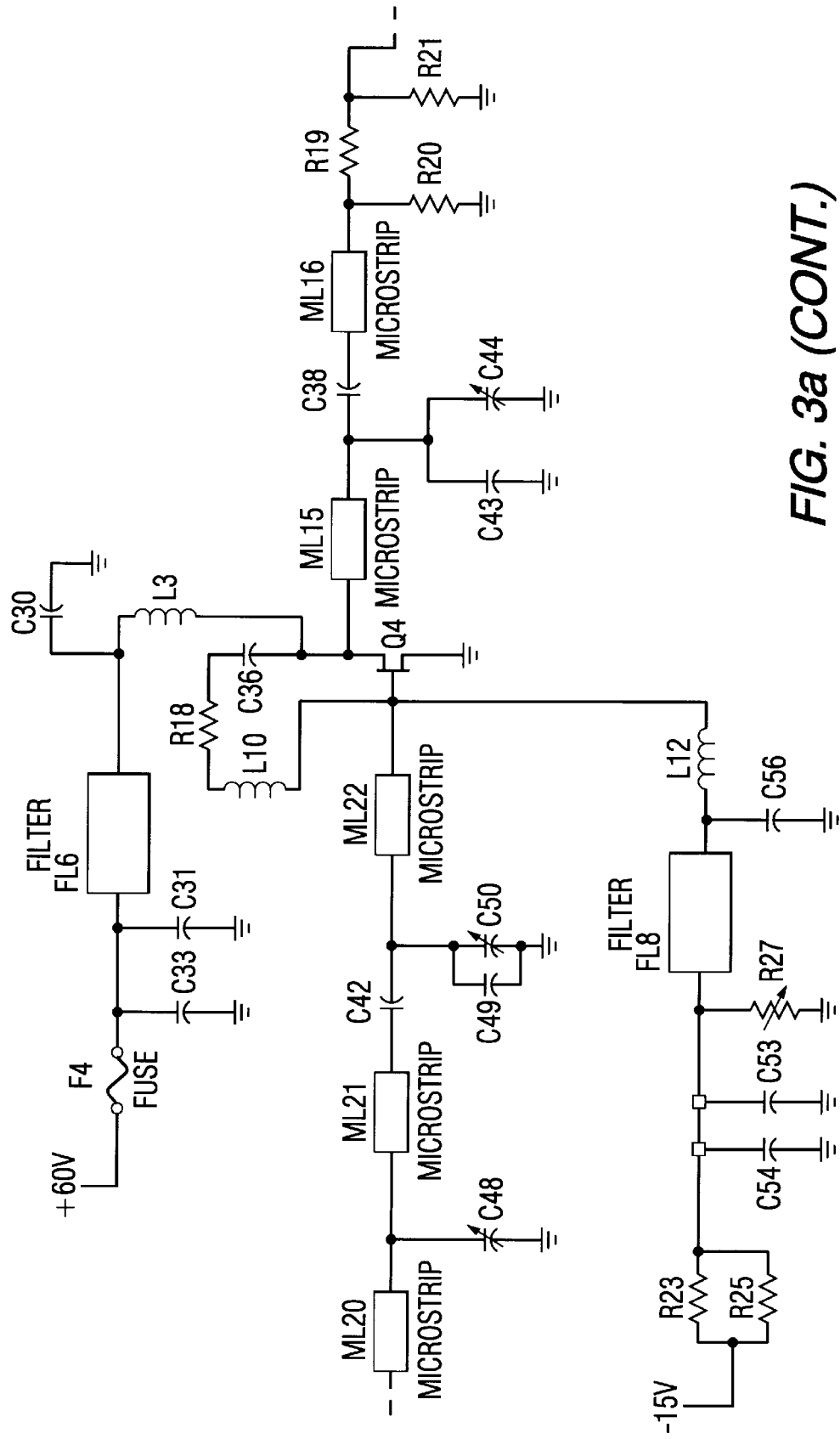
Figure 3B:
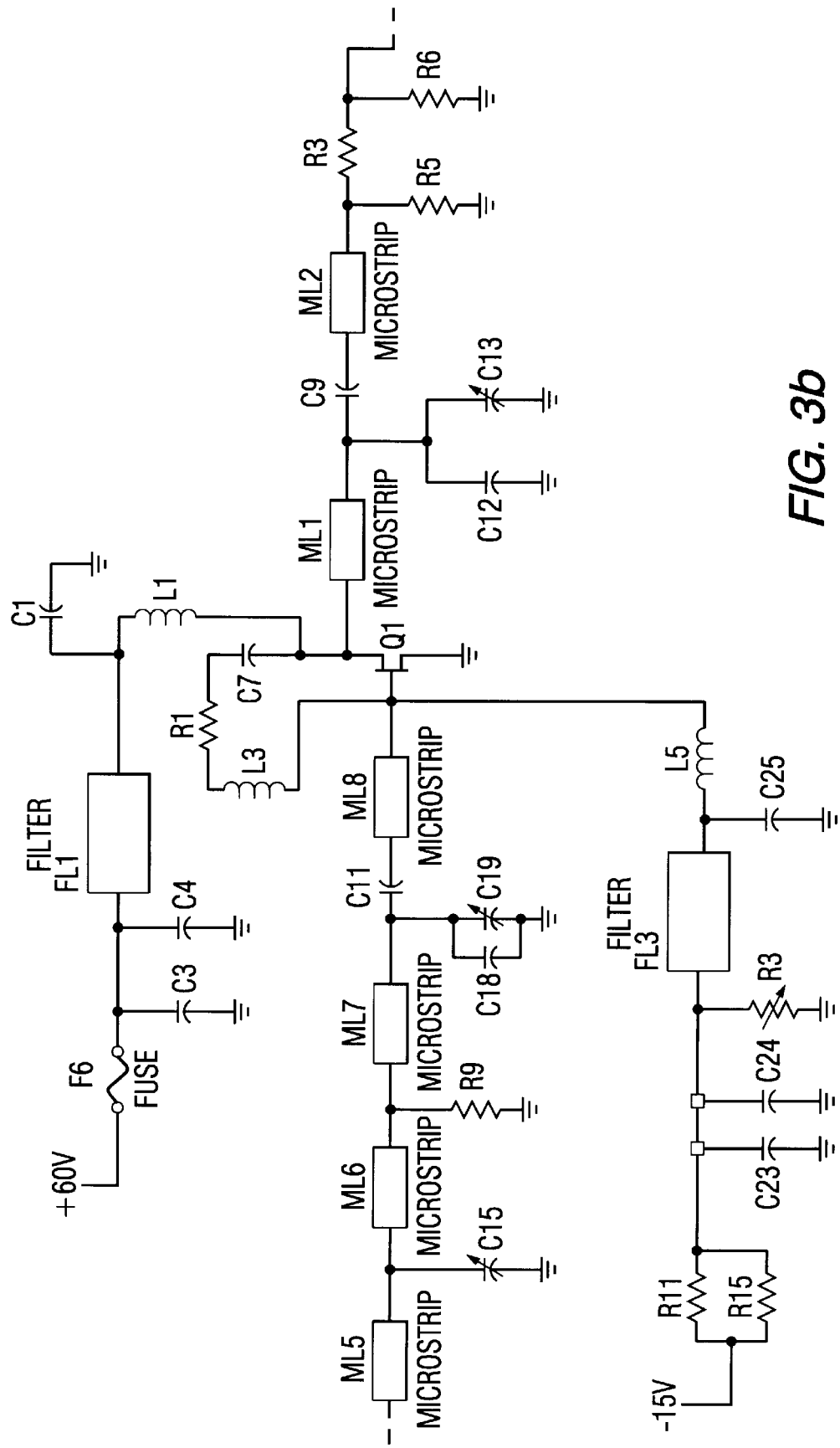
Figure 3B:
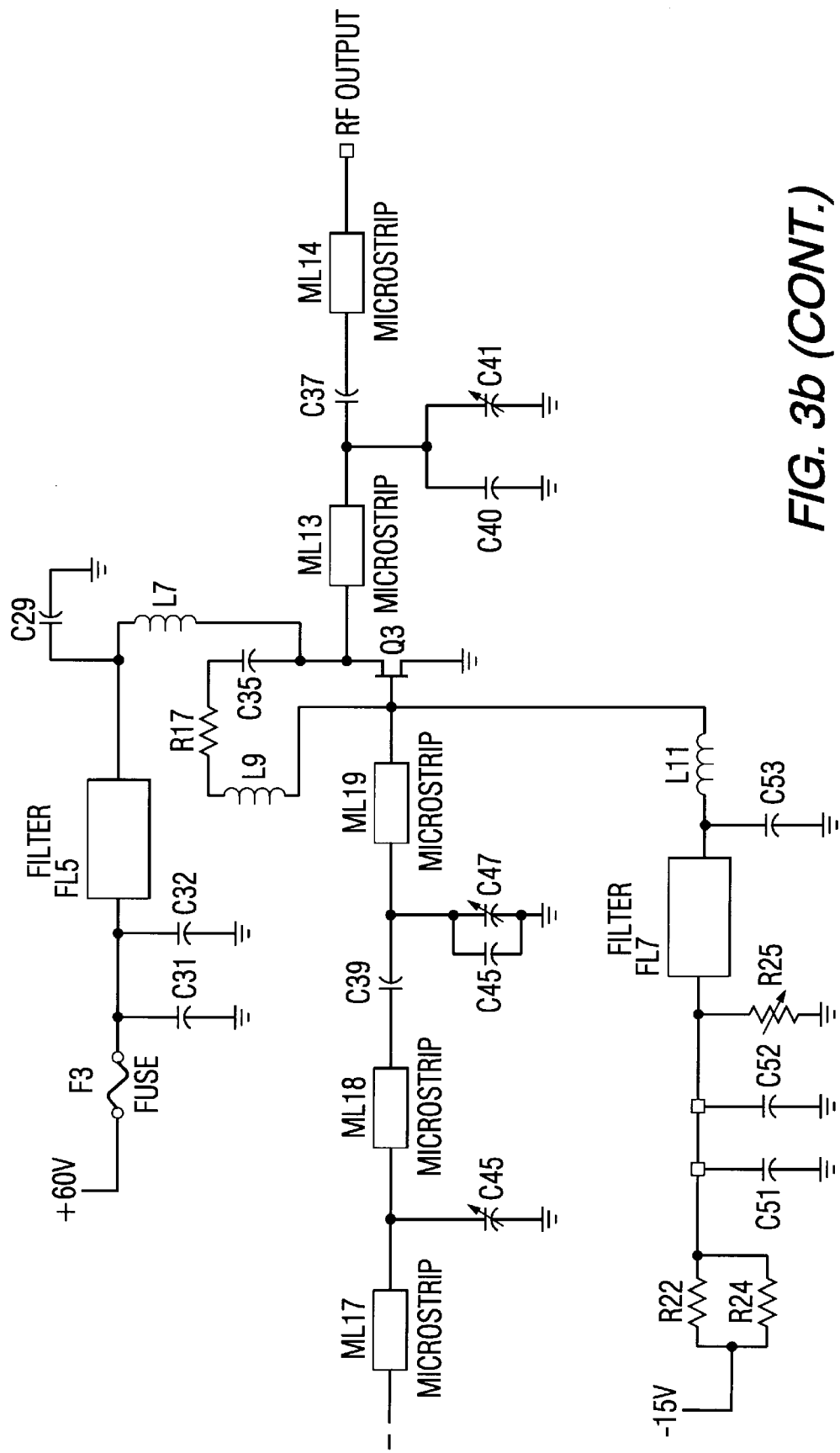

Referring now to FIG. 3a and FIG. 3b, there is shown a detailed circuit schematic diagram of one possible embodiment of the amplification section of preamplifier 10. The correspondence between the electrical components shown and the functional units of FIG. 2 which they embody should be readily apparent to one skilled in the art; therefore, only certain components are described in further detail.

Input and output matching circuits 140, 150 preferably include among their components a plurality of microstrip conductor elements. They are denoted, for example, for the first amplifying stage 100a, ML9–ML12 and ML3–ML4. The width and length dimensions of those microstrip conductors (as well as the width and length dimensions of corresponding microstrips for the other amplifying stages) are carefully controlled, primarily, for bandwidth tuning purposes. While exact width dimensions are determined based upon factors such as the given microstrip elements' substrate dielectric constants and dielectric heights, exemplary width dimensions of microstrip elements ML9–ML19 and ML3–ML4 employed in the present embodiment are shown in Table 1.

TABLE 1

| MICROSTRIP | APPROXIMATE WIDTH DIMENSION (mm) |
| --- | --- |
| ML9 | 5 |
| ML10 | 5 |
| ML11 | 32 |
| ML12 | 32 |
| ML3 | 5 |
| ML4 | 5 |

Although this invention has been described in connection with specific forms and embodiment thereof, it will be appreciated that various modifications other than those discussed above may be resorted to without departing from the spirit or scope of the invention. For example, functionally equivalent elements may be substituted for those specifically shown and described, proportional and absolute quantities of the elements shown and described may be varied, and particular elements may be repositioned or interposed, all without departing from the spirit or scope of the invention as defined in the appended claims.

What is claimed is:

1. A preamplifier system for amplifying and conditioning an input electromagnetic signal for insertion into a high power amplifier comprising:

(a) a plurality of cascaded amplifying stages for incrementally amplifying said input electromagnetic signal, each of said amplifying stages including at least one transistor assembly defined by a plurality of integrally formed silicon carbide transistor cells coupled one to the other, said transistor assembly of at least one of said amplifying stages having integrated therein a greater number of silicon carbide transistor cells than said transistor assembly of at least one other of said amplifying stages;

(b) bias control means coupled to said amplifying stages for electrically biasing each said amplifying stage, respectively, to operate in one of a plurality of predetermined operational modes including a Class A mode and a Class AB mode, said bias control means maintaining at least one of said amplifying stages in said Class A mode; and, (c) adjustable phase shift means coupled to at least one of said amplifying stages for shifting the phase of said input electromagnetic signal with respect to a predetermined reference signal.

2. The preamplifier system as recited in claim 1 wherein said bias control means maintains a first pair of said amplifying stages in said Class A mode of operation.

3. The preamplifier system as recited in claim 2 wherein said bias control means maintains a second pair of said amplifying stages in said Class AB mode of operation.

4. The preamplifier system as recited in claim 3 wherein said transistor assemblies of said first pair of said amplifying stages each include six silicon carbide transistor cells and said transistor assemblies of said second pair of said amplifying stages each include twelve silicon carbide transistor cells.

5. The preamplifier system as recited in claim 1 wherein said bias control means includes stabilization circuitry adapted to substantially abate operational oscillation of said amplifying stages.

6. The preamplifier system as recited in claim 5 wherein said stabilization circuitry includes a passive feedback circuit coupled to each said transistor assembly.

7. The preamplifier system as recited in claim 4 further comprising variable attenuator means coupled to said adjustable phase shift means and adapted to reversibly attenuate the amplitude of said input electromagnetic signal responsive to a control system.

8. The preamplifier system as recited in claim 7 further comprising a fixed attenuation unit respectively coupled at least to each of said amplifying stages of said first amplifying stage pair.

9. The preamplifier system as recited in claim 1 further comprising matching circuit means coupled to each of said transistor assemblies, said matching circuit means tuning said amplifying stages for operation in a UHF TV frequency range.

10. The preamplifier system as recited in claim 9 wherein said matching circuit means operably define for each of said amplifying stages an operational frequency bandwidth greater than approximately 24 MHz.

11. A preamplifier system adapted for actuation by a control system to amplify and condition an input electromagnetic signal for insertion into a high power amplifier comprising:

(a) an adjustable phase shift unit for shifting the phase of said input electromagnetic signal with respect to a predetermined reference signal;

(b) a variable attenuation unit coupled to said adjustable phase shift unit for reversibly attenuating the amplitude of said input electromagnetic signal responsive to said actuation by said control system;

(c) an amplification section coupled to at least one of said adjustable phase shift and said variable attenuation units, said amplification section including:

(1) a plurality of cascaded amplifying stages for incrementally amplifying said input electromagnetic signal, each of said amplifying stages including at least one transistor assembly defined by a plurality of integrally formed silicon carbide transistor cells coupled in parallel one to the other;

(2) bias control circuitry coupled to said amplifying stages for electrically biasing said amplifying stages, respectively, to operate cooperatively in a substantially linear manner, said bias control circuitry operably configuring at least one of said amplifying stages for operation in a Class A mode and at least one of said amplifying stages for operation in a Class AB mode; and, (3) matching circuitry coupled to each of said transistor assemblies.

12. The preamplifier system as recited in claim 11 wherein said bias control circuitry maintains at least a first pair of said amplifying stages in said Class A mode of operation.

13. The preamplifier system as recited in claim 12 wherein said bias control circuitry maintains at least a second pair of said amplifying stages in said Class AB mode of operation.

14. The preamplifier system as recited in claim 12 wherein said transistor assemblies of said first pair of said amplifying stages each include six silicon carbide transistor cells and said transistor assemblies of said second pair of said amplifying stages each include twelve silicon carbide transistor cells.

15. The preamplifier system as recited in claim 11 wherein said bias control circuitry includes a stabilization circuit portion adapted to substantially abate operational oscillations of said amplifying stages.

16. The preamplifier system as recited in claim 15 wherein said stabilization circuit portion includes a passive RCL feedback circuit coupled to each said transistor assembly.

17. The preamplifier system as recited in claim 13 further comprising a fixed attenuation unit respectively coupled at least to each of said amplifying stages of said first amplifying stage pair.

18. The preamplifier system as recited in claim 11 wherein said matching circuitry operably defines for each of said amplifying stages an operational frequency bandwidth greater than approximately 24 MHz.

19. A preamplifier system for amplifying and conditioning an input electromagnetic signal for insertion into a high power amplifier comprising:

(a) adjustable phase shift means for shifting the phase of said input electromagnetic signal with respect to a predetermined reference signal;

(b) an amplification section coupled to said adjustable phase shift means, said amplification section containing:

(1) a plurality of cascaded amplifying stages for amplifying said input electromagnetic signal, each of said amplifying stages including at least one transistor assembly defined by a plurality of integrally formed silicon carbide transistor cells coupled in parallel one to the other; and, (2) bias control means coupled to said amplifying stages for electrically biasing each said amplifying stage, respectively, to operate in one of a plurality of predetermined operational modes including a Class A mode and a Class AB mode, said bias control means maintaining a first pair of said amplifying stages in said Class A mode of operation and a second pair of said amplifying stages in said Class AB mode of operation, whereby said amplifying stages are adapted to operate cooperatively in substantially linear manner.

20. A preamplifier system as recited in claim 19 wherein said bias control means includes a passive feedback circuit coupled to each said transistor assembly and adapted to substantially abate operational oscillations of said amplifying stages.

21. The preamplifier system as recited in claim 19 wherein said transistor assemblies of said first pair of said amplifying stages each include six silicon carbide transistor cells.

22. The preamplifier system as recited in claim 19 wherein said transistor assemblies of said second pair of said amplifying stages each include twelve silicon carbide transistor cells.

23. The preamplifier system as recited in claim 19 further comprising matching circuit means coupled each of said transistor assemblies, said matching circuit means operably defining for each of said amplifying stages an operational frequency bandwidth greater than approximately 24 MHz.

* * * * *